(12) United States Patent
Keshavarz Akhlaghi et al.

(10) Patent No.: US 11,960,107 B2
(45) Date of Patent: Apr. 16, 2024

(54) NANO-STRUCTURES PATTERNED ON MICRO-STRUCTURES (71) Applicant: NANOTECH SECURITY CORP., Burnaby (CA)

(72) Inventors: Mohsen Keshavarz Akhlaghi, North Vancouver (CA); Clint Landrock, North Vancouver (CA)

(73) Assignee: Nanotech Security Corp. (CA)

( * ) Notice: Subject to any disclaimer, the term of this patent is extended or adjusted under 35 U.S.C. 154(b) by 315 days.

(21) Appl. No.: 16/962,174

(22) PCT Filed: Jan. 17, 2019

(86) PCT No.: PCT/CA2019/050065
§ 371 (c)(1),
(2) Date: Jul. 14, 2020

(87) PCT Pub. No.: WO2019/140527
PCT Pub. Date: Jul. 25, 2019

(65) Prior Publication Data
US 2020/0341174 A1  Oct. 29, 2020

Related U.S. Application Data

(60) Provisional application No. 62/618,462, filed on Jan. 17, 2018.

(51) Int. Cl.
*G02B 5/02* (2006.01)
*B42D 25/324* (2014.01)
(Continued)

(52) U.S. Cl.
CPC .......... *G02B 5/0231* (2013.01); *G02B 5/008* (2013.01); *G02B 5/0215* (2013.01);
(Continued)

(58) Field of Classification Search
CPC .... G02B 5/0231; G02B 5/008; G02B 5/0215; G02B 5/0268; G02B 27/4233;
(Continued)

(56) References Cited

U.S. PATENT DOCUMENTS 9,827,802 B2  11/2017  Fuhse et al.
2004/0229022 A1*  11/2004  Bourdelais ........... B42D 25/328
                                                      428/195.1

(Continued)

FOREIGN PATENT DOCUMENTS

AU  2015243835  11/2016
CN  103043596  4/2013
(Continued)

OTHER PUBLICATIONS

EP Search Report in European Appln. No. 19741824, dated Sep. 23, 2021, 3 pages.
(Continued)

*Primary Examiner* — Wyatt A Stoffa
*Assistant Examiner* — Mitchell T Oestreich
(74) *Attorney, Agent, or Firm* — Fish & Richardson P.C.

(57) ABSTRACT

Described are optical elements or displays using micro-structures and nano-structures formed conformally thereon that operate to generate optical effects. Such elements and displays may be useful for applications such as displays, and anti-counterfeiting.

25 Claims, 10 Drawing Sheets

(51) Int. Cl.
*B42D 25/328* (2014.01)
*B42D 25/373* (2014.01)
*B42D 25/425* (2014.01)
*G02B 5/00* (2006.01)
*G02B 27/42* (2006.01)

(52) U.S. Cl.
CPC ....... *G02B 5/0268* (2013.01); *G02B 27/4233* (2013.01); *B42D 25/324* (2014.10); *B42D 25/328* (2014.10); *B42D 25/373* (2014.10); *B42D 25/425* (2014.10)

(58) Field of Classification Search
CPC .. B42D 25/324; B42D 25/328; B42D 25/373; B42D 25/425
USPC ......................................................... 359/599
See application file for complete search history.

(56) References Cited

U.S. PATENT DOCUMENTS

| | | | |
|---|---|---|---|
| 2005/0128590 A1 | 6/2005 | Schilling et al. | |
| 2010/0194091 A1* | 8/2010 | Heim | B42D 25/351 264/293 |
| 2010/0307705 A1 | 12/2010 | Rahm et al. | |
| 2014/0069496 A1* | 3/2014 | Biswas | H01L 31/02168 136/259 |
| 2015/0042702 A1 | 2/2015 | Jiang et al. | |
| 2016/0325823 A1 | 11/2016 | Rawlings et al. | |
| 2017/0225502 A1 | 8/2017 | Sauvage-Vincent | |

FOREIGN PATENT DOCUMENTS

| | | |
|---|---|---|
| CN | 106126768 | 11/2016 |
| WO | WO 2008/049533 | 5/2008 |
| WO | WO 2009/083151 | 7/2009 |
| WO | WO 2014/023415 | 2/2014 |
| WO | WO 2015/154943 | 10/2015 |

OTHER PUBLICATIONS

International Preliminary Report on Patentability in International Appln. No. PCT/CA2019/050065, dated Jul. 21, 2020, 6 pages.
International Search Report and Written Opinion in International Appln. No. PCT/CA2019/050065, dated Apr. 11, 2019, 8 pages.
Tan et al., "Plasmonic Color Palettes for Photorealistic Printing with Aluminum Nanostructures," Nano Letters, 2014, 14:4023-4029.
EP Search Report in European Appln. No. 19741824, dated Jan. 26, 2022, 17 pages.

* cited by examiner

NANO-STRUCTURES PATTERNED ON MICRO-STRUCTURES

FIELD

The present disclosure relates generally to optical elements, and in particular, to optical displays using micro-structures and nano-structures that operate to generate optical effects useful for applications such as displays and anti-counterfeiting

BACKGROUND

Typical incoherent optical frequency or visible light is an electromagnetic radiation with vacuum wavelength in the range of 400 to 700 nanometers, and coherence length less than around 10 μm. The wavelength range and the coherence length provide size scales that maybe compared with the structural feature sizes on an optical component. When the minimum feature sizes of an optical component are larger than both the wavelength and coherence length, the interaction of visible light with the optical component can be understood by considering light reflection and refraction. By controlling the shapes, dimensions and materials, reflection and refraction can be used to design optical components (such as lenses, mirrors, windows, retro-reflectors, filters, prisms, and others) having various structures and functions.

Some of the smallest of such optical components are in the field of micro-optics. Displays are a typical application for micro-optical components. For example, sheets of diffusers or lenticular structures are used to build backlights with desirable attributes for liquid crystal displays, and lenticular micro-lenses are used to build 3D displays.

Some micro-optical components are capable of producing optical effects that ordinary objects do not exhibit. For example, micro-optical components may display an image that appears to move, or an image that switches on and off (alternately becoming more visible and less visible), or an image that changes color. Such optical effects may be difficult to replicate by ordinary imaging technologies such as photographs, photocopiers, or printers. Consequently, such micro-optical components can have applications in protecting important documents from counterfeiting. Such documents include banknotes, passports, event tickets, identification cards, certificates, and the like. When a user interacts with such documents, the anti-counterfeiting optical device displays content from which the user may be assured that the document is authentic. Anti-counterfeiting optical devices further function as a barrier to reproduction of original documents by unauthorized people. In addition to protecting documents, goods and brands can be protected or enhanced in similar fashion. Such optical devices may be used as overt security features, in which an authenticator (or a user) does not need any special authentication device to verify the authenticity. Such optical devices may also be used as device-assisted security features in which an authentication tool or machine is used to read optically encoded information not normally visible to the human eye.

Many available micro-optical anti-counterfeiting devices rely on micro-lens or micro-mirror arrays. For example, one approach employs micro-lens arrays to display unicolor icons or bars that appear to move when an authenticator (or a user) tilts the security feature. Another example relies on engineered micro-mirrors to display simple geometric shapes such as solid rectangles, positions of which shift with tilt of the security feature. Micro-lens based features have a typical thickness in the range of 20 μm, and therefore may not be suitable for surface installation on thin secure documents like banknotes. Micro-mirror based features can be made thinner, but they typically provide a limited space for engineering the final optical effect.

The method of manufacturing such micro-optical devices is well known and considered standard in the industry. Optical designers design the structure of the device including structural profiles, materials and layers. A master mold that has the required surface profiles is then originated using a variety of micro-fabrication methods. These may include lithography, etching, micro-machining, laser ablation, ion milling, or any set of similar methods that are known to those who are familiar with the field. The resulting surface profiles or patterns on a master wafer, may be recombined or repeated over larger sheets using, for example, casting or embossing techniques. A resulting large master or shim made from the recombination may be rolled in a casting or embossing machine capable of replicating the patterns on media such as thin sheets of plastic. Additional coatings and layers, such as metals, adhesives and lacquers, can be applied to form the final product. Design and origination of the master mold is typically a very expensive process, but all subsequent repeat and copy processes bring the cost per final product to a low level for high volume production.

When at least one dimension of an optical component is smaller than the coherence length, the interaction of visible light with the object may result in light interference and diffraction in addition to reflection and refraction. Interference (constructive or destructive) has long been used in creation of optical filters and coatings. Diffraction has long been used in optical instruments like spectrum analyzers. Because the coherence length of typical everyday visible light is in less than around 10 μm range, the observation of interference and diffraction in ordinary lighting conditions (that is, under no laser or coherent source) signals the object the light is interacting with has at least one dimension less than around 10 μm. An optical component that uses interference or diffraction to display a visual content may be used as an optical anti-counterfeiting device. That is because dimensions less than around 10 μm are outside the size ranges that can be accurately controlled by many ordinary imaging technologies and instruments.

There are two important types of optical anti-counterfeiting devices in this range of dimensions: color shifting films, and surface holograms. Color shifting films are layered flat structures made of dielectrics, metals, or a combination. The interference resulting from light reflection and refraction at layer boundaries forms an optical filter, colors of which change with the observation angle. Here, the dimension that is smaller than the coherence length of incident light is in the vertical direction (i.e. thickness of the layers). An example employs optical thin film technology to secure banknotes. Here, a key challenge is to control the thickness of deposited layers with nanometer precision, otherwise the film will show colors other than the designed colors. Such control makes the large-scale fabrication difficult, and the final product relatively expensive. Surface holograms are planar textured surfaces covered with a metal or dielectric with index of refraction higher than that of surrounding medium. The textures have spatial periodicity components smaller than the incident light's coherence length but larger than half the wavelength. Diffraction patterns resulted from such surface can display a static image the colors and intensities of which change with observation angle. Such structures may also display 3D images, animations, image switches, and others, both monochromatic or in true-colors. An example of such devices is holograms commonly found on credit cards. Surface holograms are materially and structurally different from that of micro-optical components, and therefore they demand different techniques for fabricating a master mold. However, the mass production of the two may be achieved through similar process steps of casting, embossing, and coating. Hologram based security features are being considered less secure as technology advances in the field of laser holograms has made holograms more accessible to the public.

Most of the functions of micro-optical components can be understood and engineered using ray or geometrical optics (which treat light as rays and enable calculation of ray propagation direction and efficiencies). Analysis of interference and diffraction as described above may be done using wave (or physical) optics. However, when all the dimensions of an object approach the wavelength of incident light or smaller values, full solution of Maxwell's Equations is often needed to correctly describe the physics involved. As the wavelength of visible light is in submicron range (i.e., in nanometer range), the interaction of visible light with such small objects resides in the field of nano-optics. For example, photonic crystals are spatial arrangements of subwavelength features that result in interesting optical phenomena such as the creation of photonic band gaps, cavities, and guides, among others. Another example is a spatial arrangement of subwavelength features in a metallic medium to enable excitation of plasmons. Excitation of plasmons results in optical phenomena like enhanced or weakened scattering, absorption, reflection, transmission, and others. Nano-optical phenomena may result in unusual macroscopic effects observable by the naked eye or by an instrument, and therefore may find applications for optical security devices. An example of such relies on diffraction resulted from periodic arrangement of nano features to display reflective optical security features. Another example of such devices relies on excitation of surface plasmons to display a transmissive optical security feature.

SUMMARY

The present disclosure is generally directed to a new category of optical devices. Such optical devices may find applications in displays and anti-counterfeiting devices, for example.

In a broad aspect of the invention, an optical device comprises a planar substrate, a plurality of micro-structures made on at least portions of the planar substrate and a plurality of nano-structures made conformal to at least the portions of the micro-structures to create structural colors from incident light. In all embodiments, the micro-structures are configured to direct the incident light on the nano-structures to a space above or below the optical device, the micro-structures have a thickness less than 50 μm and more than 1 μm, and the nano-structures have at least one feature size less than 500 μm.

In another broad aspect of the invention, an optical device comprises a surface feature formed on a substrate with an in-plane feature sizes of 2 μm or more and a height variation of a few micros to 50 μm, thereby defining a micro surface, and having textures and coating conformal to at least portions of said surface with three-dimensional minimum feature sizes of 500 nm or less, thereby defining plural nano-structures.

In another broad aspect of the invention, an optical device comprises a planar substrate, a plurality of micro-sized surface features extending from a plane of the planar substrate, having a height variation less than 50 μm and more than 1 μm, thereby defining plural micro-structures, and structural means for creating an optical effect on incident light formed on the micro-surfaces and conforming to some or all of the features of the micro-surfaces. In an embodiment, the optical effect can be a plasmonic optical effect. In another embodiment, the optical effect can be a diffractive optical effect.

In another broad aspect of the invention, a method for forming an optical device comprises forming on a mold, a plurality of micro-surface features extending from a plane of the mold less than 50 μm and more than 1 μm, thereby defining plural micro-surfaces, forming a plurality of structural features having at least one feature size of less than 500 nm on the micro-surfaces of micro-structures to form nano-structures, and employing the mold to imprint on a separate device substrate said micro-structures and nano-structures.

Further aspects of the invention are set out in the following detailed description of the invention.

DETAILED DESCRIPTION

Figure 1:
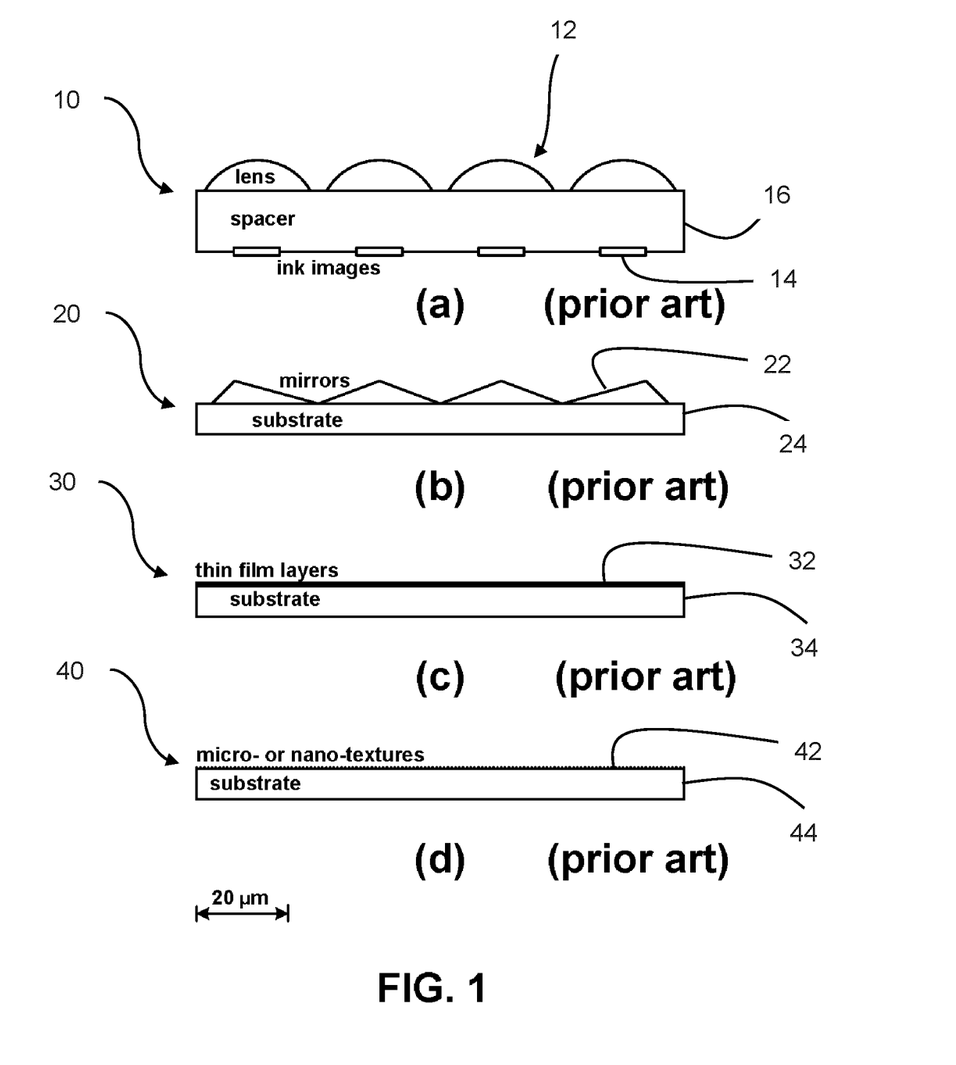
FIG. 1 is an illustrative depiction of prior art optical devices.

FIG. 1 illustrates various general aspects of relevant prior art optical devices, on approximately the same size scale. FIG. 1(a) depicts a conventional micro-optical device 10 that uses micro-lenses 12 to image micro-ink prints 14 to a user that observes the device from the top. The micro-ink prints are placed at a distance from the lenses by using a transparent spacer layer 16. Light reflected off inks and physically coupled to the spacer is transmitted through the spacer and through the micro-lenses. FIG. 1(b) depicts another conventional micro-optical device 20 that uses micro-mirrors 22 placed on a substrate 24 to display a visual content to a user that observes the device from the top. Both of the devices of FIGS. 1(a) and (b) work based on light reflection and refraction. FIG. 1(c) depicts another conventional device 30 that includes one or more thin film layers 32 placed on a substrate 34. The device works based on optical interference effects. FIG. 1(d) depicts another conventional device 40 that includes micro- or nano-textures 42 placed on a substrate 44. The device may work based on variety of optical effects like diffraction, plasmonic (such as those produced by plasmonic structures and materials), photonic (such as those produced by photonic crystals), optical guides, and optical antennas, among others. The sizes of the devices depicted in FIG. 1 are rough approximates, and the figure is not meant to describe a specific device. However, FIG. 1 illustrates and compares the typical range of prior art device structural features that work based on different physics described above. FIG. 1 is an illustration of the core optical elements; and in practice, the depicted devices may have additional layers (e.g. protective lacquers, adhesives, release layers, or others).

The core element of micro-lens and micro-mirror devices on FIGS. 1(a) and (b) are non-flat, that is they have substantial thickness variation that extents above the spacer or the substrate. Though the thickness variation may be only a matter of a few microns, it is this thickness variation that enables the optical function of the devices. In comparison, the thin films of the devices of FIG. 1(c) and the surface of the devices of FIG. 1(d) are substantially close to flat. Therefore, it is clear that the prior art devices depicted in FIG. 1 can be divided into two structural categories. In the first category are the devices in which the functional element is a non-flat surface with thickness variation of a few microns or more (e.g. those depicted in FIGS. 1(a) and (b)). Such devices do not contain any additional micro- or nano-textures like that of FIG. 1(d). In the second category are the devices in which the functional element is flat or close to flat (e.g. those depicted in FIGS. 1(c) and 1(d)). Such devices do not have any thickness variations of a few microns or more. The optical devices described below, similar to the first category, may have a non-flat core functional element with height variations of a few microns or more. However, they also include submicron sized features, similar to the second category. In all of the devices described here, the spacers or substrates define a plane for the device (the plane may be but need not be strictly planar; the plane may be substantially a plane, with a bend or curvature perceivable on a larger scale).

Figure 2:
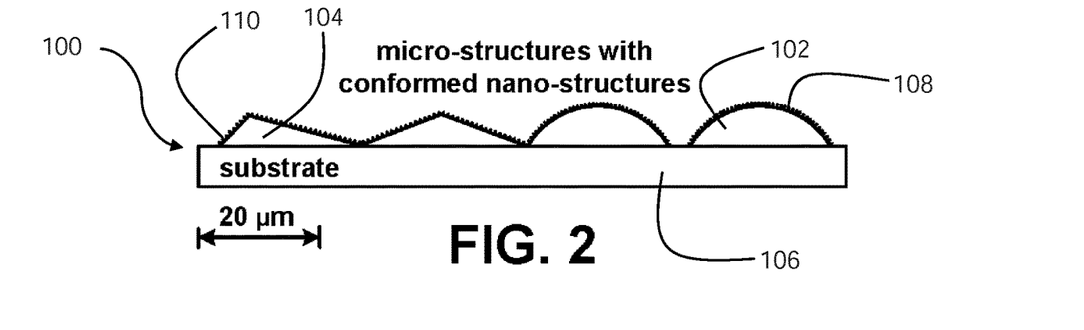
FIG. 2 is an illustrative depiction of an optical device comprising micro-structures with nano-structures conformed thereon.

FIG. 2 shows a schematic of an optical device 100 in accordance with an embodiment of the invention on the same size scale as FIG. 1. The sizes are rough approximates and the figure is not meant to describe a specific device design for a specific application. FIG. 2 helps demonstrate some structural differences of the disclosed invention in comparison to prior art optical devices depicted in FIG. 1. The optical device of FIG. 2 includes both micro- and nano-structures spread over the functional surface of the device. Specifically, micro-structures of two different shapes 102, 104 are shown provided on a substrate 106. (In the following the term "substrate" will be used to also include spacer layers as described above and more generally any structure on which optical structures may be formed or supported, directly or indirectly.) The micro-structures have surfaces ("micro-surfaces") on which nano-structures 108, 110 are formed. In one aspect the device of FIG. 2 is superficially similar to the devices of FIGS. 1(a) and 1(b): both have a non-flat functional element with height variations of a few microns or more. In another aspect the device of FIG. 2 is superficially similar to the devices of FIG. 1(d): both have a functional element that includes sub-micron features. However, as described below, the structure, physics and optical function of the device of FIG. 2 fits neither of the prior art device categories. The final device may include structures not depicted in FIG. 2, such as additional layers like protective layers, adhesive layers, index matching layers, or others; but the main function of the device will be determined by a functional element similar to the one depicted in FIG. 2.

A few examples of the envisioned optical effects realizable with the disclosed optical structures is described below. These should be regarded as exemplar functions the structures can offer, and the examples are not meant to place any restriction on the optical effects/functions such structures may offer in future. In the descriptions below, scales of structures are important. On a large scale, the devices resemble planar structures, with the micro- and nano-structures not being readily visible to the naked eye. On this scale, the devices may appear planar (although the devices may be flexible and may be subject to bending) and as used in the following claims the term "planar" or "generally planar" refers to such large scale characteristic unless otherwise specified. On a smaller scale, the micro-structures are visible (typically with some magnification instrument). Many of the micro-structures described below are not planar at this scale, but are three-dimensional. Exemplary sizes and shapes of such micro-structures are described below, but in general, the layer of micro-structures has a thickness less than 50 μm and more than 1 μm. On a still smaller scale, nano-structures (such as nano-holes, nano-columns, nano-slits, nano-disks, etc.) become visible. Such nano-structures themselves are three-dimensional. Nano-structures are conformal to the micro-structures, and therefore follow the contours of the micro-structures. The nano-structures may conform to all or portions of the micro-surface, continuously or in a piecewise manner, in accordance with the specific embodiment and application. Exemplary sizes and shapes of such nano-structures are described below, but in general, the nano-structures have at least one feature size smaller than 500 nm.

Figure 3:
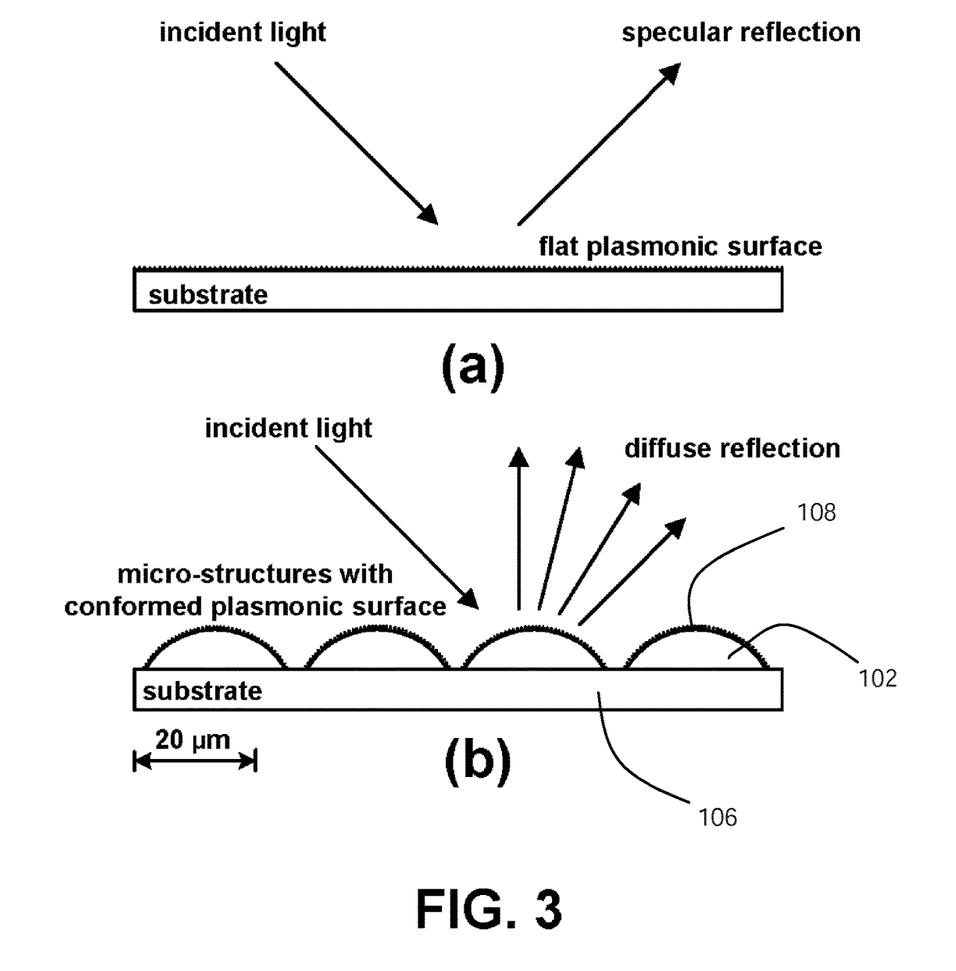
FIGS. 3(a) and 3(b) are illustrative depictions of plasmonic optical devices.

FIG. 3(b) illustrates an embodiment of the invention employing plasmonic nano-structures 108 conformed to micro-structures 102, and FIG. 3(a) illustrates what may happen when visible incident light interacts with a flat plasmonic surface. A plasmonic surface is typically made of an arrangement of metallic nano-particles, nano-perforations, or nano-antennae in a thin metallic film (thickness <0.3 μm). The arrangement maybe periodic with any unit cell shape, or may be aperiodic. Particles or perforations may have any three-dimensional shape with minimum feature sizes of 0.5 μm or less. The metal may be aluminum, gold, silver, copper, chromium, nickel, or any metal or metal-alloy with good enough specifications for plasmonic applications. The typical average distance between such particles or perforations may be in a range less than the wavelength of incident light (less than ~1.0 μm). For these range of dimensions, and for appropriately designed structures, the plasmonic surface can act more as a mirror-like filter than a planar diffractive surface. That is the incident light is absorbed, transmitted, or reflected through excitation of plasmons, and this phenomena takes place more efficiently than diffraction. This description outlines what defines 'plasmonic surface' throughout this document.

Because the excitation of plasmons, their properties, and also emission of light from them are all wavelength-dependent, reflected and transmitted visible white light from a plasmonic surface takes a color and an intensity. Depending on the design (or geometry or surface structures or materials) of the plasmonic surface, both the color and the intensity are changed. A large surface can be divided into many pixels each colored differently with utilization of different plasmonic structures to display a visually observable content in reflection and/or in transmission. This approach of displaying content on a plasmonic surface has been reported mostly in academic publications (e.g., see Shawn J. Tan et al, Plasmonic Color Palettes for Photorealistic Printing with Aluminum Nanostructures, Nano Letters, v14, p 4023, 2014). A common feature of all such reports so far is that they are flat plasmonic surfaces. That is, they are structurally similar to devices depicted in FIG. 1(d) or FIG. 3(a).

Reflection from a flat plasmonic surface may be specular (i.e. mirror-like—see FIG. 3(a)). A large planar plasmonic surface thus appears much as a mirror: it appears too dark when it does not directly reflect the incident light to the observer's eyes, and appears too bright when it directly reflects the incident light to the observer's eyes. This mirror-like character is very unpleasant for observation of plasmonic contents described above; and it renders application of such contents practically difficult. This is especially true for reflective plasmonic displays. The best reflective displays like traditional paper and inks should have a diffuse character, otherwise they appear too glossy for easy use.

An embodiment of the present invention addresses this issue. FIG. 3(b) shows the structure. Here, the plasmonic surface is made conformal to a micro-surface, the micro-surface corresponding to one or more non-flat micro-structures 102, in contrast with a plasmonic surface made on a flat or planar substrate as shown in FIG. 3(a). Throughout this document, a 'micro-surface' refers generally to a layer of micro-structures with a thickness less than 50 μm and more than 1 μm. Examples of two different micro-surfaces are depicted in FIG. 2 which correspond to the surfaces of micro-structures 102, 104. In the device of FIG. 3(b), the color generation mechanism is through the working of a plasmonic surface, but the viewing angles of the plasmonic content are determined by the design of the micro-surface. For the specific example of FIG. 3(b), the function of the micro-surface is to spread the reflected lights over a large spread of angles to convert the mirror-like reflection from a flat plasmonic surface into a more diffuse type of reflection. Therefore, by tuning the micro-surface, this embodiment enables use of plasmonic colors to create displays with a desired level of luster. In this device, modification of the design of micro-surface can lead to plasmonic devices with an appearance similar to other, more ordinary objects such as printed inks on paper surfaces, different types of dyes or paints (e.g., flat, semi-gloss, gloss, metallic, and others), different types of colored transparent surfaces, similar to stained glass (e.g. transparent, matte, and others), different types of slides (e.g. transparent, matte, and others), or others. The optical function of the micro-surface may be accurately designed by using commercially available ray tracing software. In general the smoother (rougher) the surface, the glossier (more matte) the final device is expected to be. In the same device, modifications of plasmonic structures can lead to plasmonic devices to display different contents useful for different applications. Most of the illustrations herein are two-dimensional cross-sections of the device structures. The micro-surface for the actual devices may take any arbitrary convex or concave three-dimensional shape that falls within the specified dimensions. FIG. 3(b) illustrates an embodiment of micro-surfaces having arcuate cross-sectional shape. These may correspond to three-dimensional shapes which are cylindrical or have repeating dome shapes or sections of spherical shapes. Various other arcuate surfaces are possible.

Figure 4:
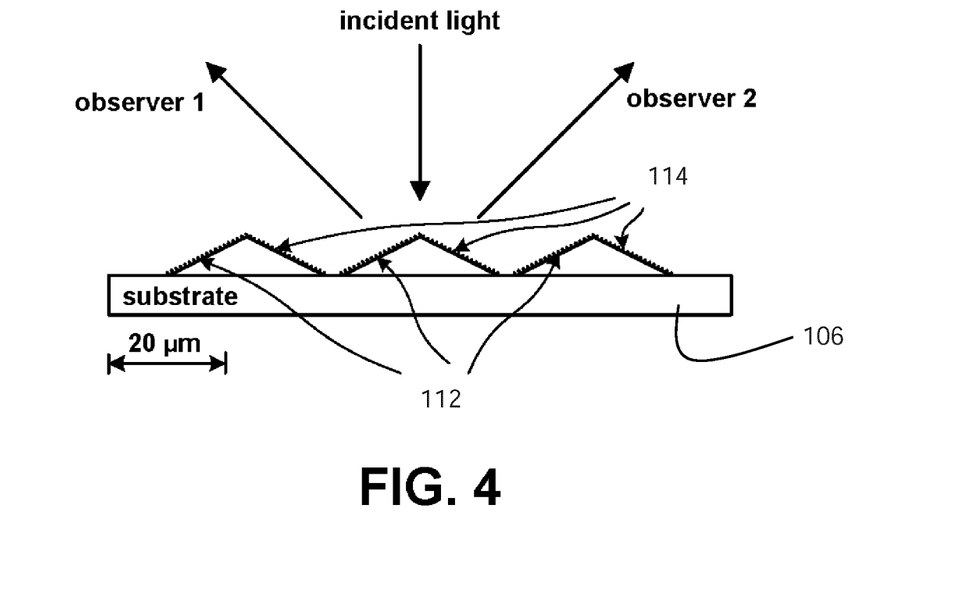
FIG. 4 is an illustrative depiction of another optical device comprising micro-structures with plasmonic pixels, which produces optical effects different from those in FIG. 3.

Another embodiment of the present invention is depicted in FIG. 4. In this embodiment, the micro-surface is shaped into a pyramidal shape (e.g. a pyramid, a wedge, or a triangular prism). A plasmonic surface 112 with pixels providing content of image #1 is made conformal to one face of the pyramids, and a second plasmonic surface 114 with pixels providing content of image #2 is made conformal to the other face of the pyramids. Specular reflection of the incident light from the two faces of the pyramids reveals content of image #1 viewable by observer #1, and content of image #2 viewable by observer #2. The device affixed to a document or product, therefore, appears to an observer as a switch from image #1 to image #2, enabled by tilt of the sample (or otherwise changing point of view or changing the direction of incident light). Image #2 maybe left blank, and the result will be a device that displays image #1 turning on and off with tilt of the sample. Faces for images #1 and #2 maybe uniformly patterned with two different types of plasmonic structures, and the result will be a device that displays plasmonic color #1 which switches to plasmonic color #2. The two observers may be two eyes of a single observer; the plasmonic content may contain two perspectives of a single scene/object; and in such case the device creates an illusion of depth similar to that of present three-dimensional televisions or theaters. The number of encoded images and their observation angles can be selected by designing the employed micro-surface. The displayed contents can be selected by utilization of appropriate plasmonic surface conformed to the micro-surface. The present invention and the resulting platform described in this embodiment is capable of yielding optical effects with strong asymmetries; and as such effects are rarely possible with other techniques, the devices are useful to function as optical anti-counterfeiting security features.

Figure 5:
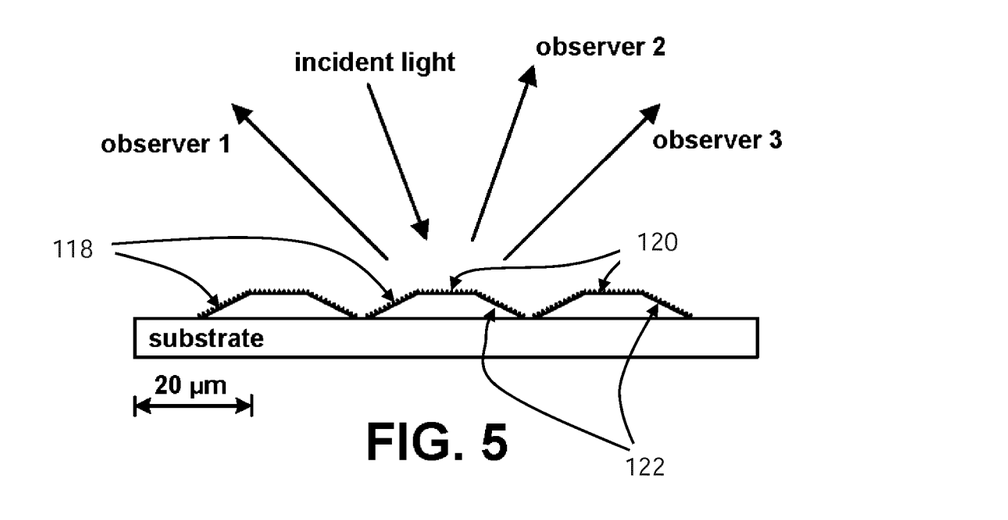
FIG. 5 is an illustrative depiction of another optical device comprising micro-structures with plasmonic pixels, which produces optical effects different from those in FIG. 3 and FIG. 4.

Another embodiment of the present invention is depicted in FIG. 5. Here the micro-surface has at least three flat faces (e.g., a frustum or truncated pyramid). A plasmonic surface 118 with pixels providing content of image #1 is made conformal to one face, a second plasmonic surface 120 with pixels providing content of image #2 is made conformal to the second face, and a third plasmonic surface 122 with pixels providing content of image #3 is made conformal to the third face. Specular reflection of the incident light from the three faces reveals contents of image #1 to image #3 viewable by observer #1 to #3. The device affixed to a document or product, therefore, appears to an observer as a switch from image #1 to image #3 enabled by tilt of the sample.

As suggested by FIG. 4 and FIG. 5, the number of faces of the micro-surface can be expanded. Consequently, the number of encoded images can be increased through an increase in the number of faces of the micro-surface. Increasing the number of faces may result in a decrease in the size of pixels of the corresponding plasmonic surfaces. Each image of such high face density micro-surface can hold a frame of an animation; and the resulting sample can show an animation displayed by tilt of the sample. The animation may appear two dimensional or three dimensional depending on the optical design of the micro-structures and nano-structures. The micro-surface for this embodiment can be a piecewise linear three-dimensional shape to keep the frame displays maximally separated, or a curved three-dimensional shape to help display of a smooth animation.

Figure 6:
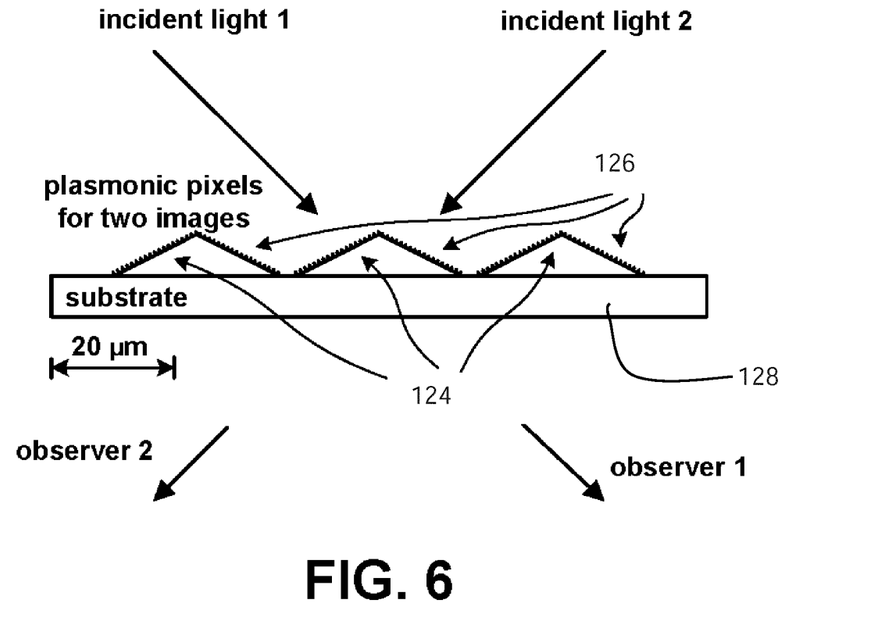
FIG. 6 is an illustrative depiction of another optical device comprising micro-structures with plasmonic pixels, which produces optical effects different from those in FIG. 3, FIG. 4, and FIG. 5.

Another embodiment of the present invention is illustrated in FIG. 6. The device is structurally similar to that of FIG. 4, but the optical function is different: the observers—instead of looking at the reflected light—look at the transmitted light. Because the incident lights #1 and #2 pass through plasmonic pixels 124, 126 of image #1 and #2, the observers #1 and #2 see the contents of image #1 and #2, respectively. The device affixed to a transparent planar substrate 128 and observed in transmission, therefore, appears to an observer as a switch from image #1 to image #2 enabled by tilt of the sample. Such device maybe installed on a polymer banknote, on a windowed banknote, on a transparent tag attached to a product, or on other similar materials to protect them from counterfeiting activities. The number of encoded images and their observation angles can be selected by designing the employed micro-surface. The displayed contents can be selected by utilization of appropriate plasmonic surface conformed to the micro-surface. The contents can be anything from complex imagery to simple colors. The displayed content can be anything from simple color shifts or switches, to switches between complex imagery, to fluid animations.

Figure 7:
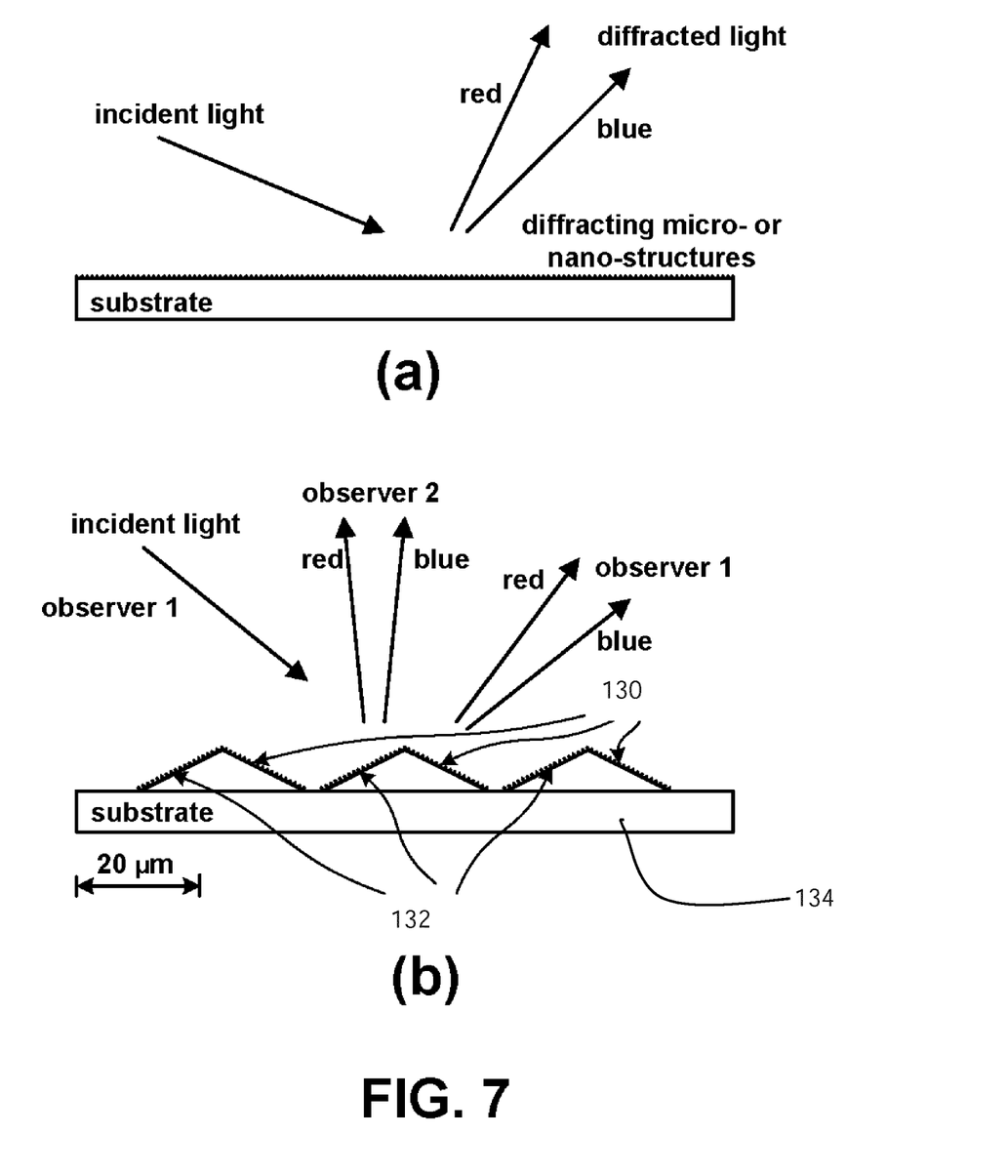
FIGS. 7(a) and 7(b) include illustrative depictions of incident light interacting with diffracting surfaces.

FIG. 7(a) illustrates what may happen when incident light interacts with a flat diffractive surface. Such surface can be made of an arrangement of metallic or dielectric nanoparticles (or structures such as nano-columns) or nano-perforations (or nano-holes or pillars or gratings) in a thin metallic or dielectric film (thickness <0.3 μm). The arrangement of nano-structures can be periodic with any unit cell shape. Particles or perforations may have any three-dimensional shape with feature sizes of 1.0 μm or less. The metal may be aluminum, gold, silver, copper, or any other metal. The dielectric may be resin, plastic, $SiO_2$, $Nb_2O_5$, $TiO_2$, ZnS, or other materials having a refractive index different than that of the surrounding layers. The array periodicity is close to the range of the wavelength of incident light (more than ~0.3 μm and less than ~1.0 μm). All the particles/perforations that make an array may be identical in shape, or they may have different shapes and sizes. For these range of dimensions, and for appropriately designed structures, the diffractive surface disperses the spectrum of the incident visible light into rainbow-like spectrums (that is, diffraction orders, one of which is shown in FIG. 7(a)). This description outlines what defines 'diffractive surface' throughout this document.

Because a flat diffractive surface disperses the incident light into its spectrum content, the surface appears colorful to an observer at an appropriate fixed angle. For particular incident and observation angles, the perceived color depends on the design (or geometry) of the diffractive surface. A large diffractive surface can be divided into many pixels each filled with a different diffractive structure. Such surface can display different contents ranging from monochromatic single images to full color three-dimensional ones. The color of such images depends on the observation and incident light angles. Such devices either through display of color changes with tilt of the sample, or through display of image switches, or through display of three-dimensional imagery or other visual effects find applications for optical anti-counterfeiting devices. For a flat diffractive surface (e.g., one having no micro-structures like that of FIGS. 1(a) and 1(b)) under a fixed incident light, tuning the diffraction angles generally requires changing the design of diffracting nano- or micro-structures.

Another embodiment of the present invention is shown in FIG. 7(b). Here, the diffractive surface is made conformal to a micro-surface, the micro-surface having one or more micro-structures. The optical effects that may be obtained with the device depicted in FIG. 7(b) are in contrast with the optical effects that may be obtained with the device depicted in in FIG. 7(a). In the device depicted in FIG. 7(b), the color generation mechanism is through the working of a diffractive surface, but the viewing angles of the diffractive content is determined by both the design of the micro-surface and that of diffractive surface. For the specific example of FIG. 7(b), the micro-surface offers two flat faces. Pixels of image #1 are made by making the corresponding diffractive surface 130 conformal to face #1, and pixels of image #2 are made by a second diffractive surface 132 conformal to face #2. The angles the two faces make with the planar substrate 134 provide degrees of freedom, using which the contents of the two diffractive faces can be spatially separated. Therefore, observer #1 sees the content of image #1, and observer #2 sees the content of image #2. Colloquially, two observers looking at the device at the same time under the same lighting conditions may see two distinct images with distinct colors. The device affixed to a document or product, therefore, appears to an observer as a switch from image #1 to image #2 enabled by tilt of the sample. The number of encoded images and their observation angles can be changed through the design of an appropriate three-dimensional micro-surface and the diffractive surface conformal to it. The device may display discrete switches between diffractive contents, animations, three-dimensional contents, or a combination of these optical effects.

Figure 8:
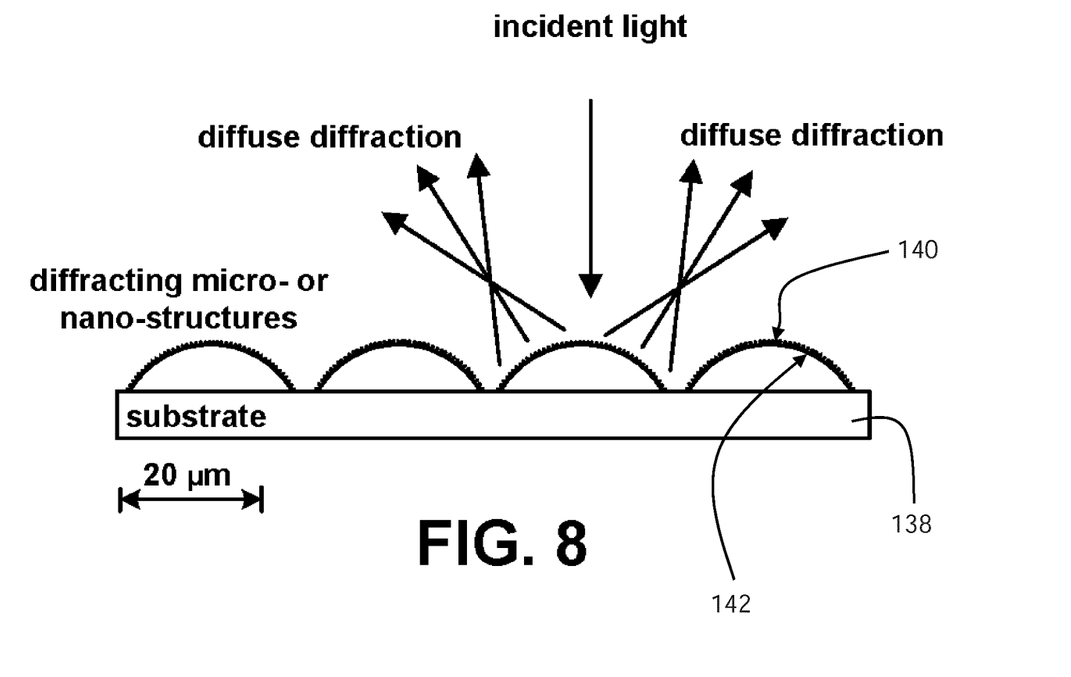
FIG. 8 includes an illustrative depiction of incident light interacting with another embodiment of diffracting surfaces.

Another embodiment of the present invention is depicted in FIG. 8. Here, the diffractive surface 140 is made conformal to a micro-surface 142 formed on substrate 138 with appropriate design to heavily spread the diffracted rays. The diffracted light therefore appears as a diffused light rather than specular as that shown in FIG. 7(a). Compared to present flat diffractive surface devices (such as that of FIG. 7(a)), the device of FIG. 8 displays a more diffused content. The device may thus appear as prints on normal paper but made by highlight markers, rather than flashy as normal flat diffractive surface devices may appear to be. Of special interest for devices of this embodiment are diffractive surfaces with periodicities between ~0.3 μm and 0.5 μm. For this range of periodicities, the spectrum of diffracted light may lack red side of the spectrum; and this helps device designers manage a diffused diffraction in creation of meaningful contents.

Figure 9:
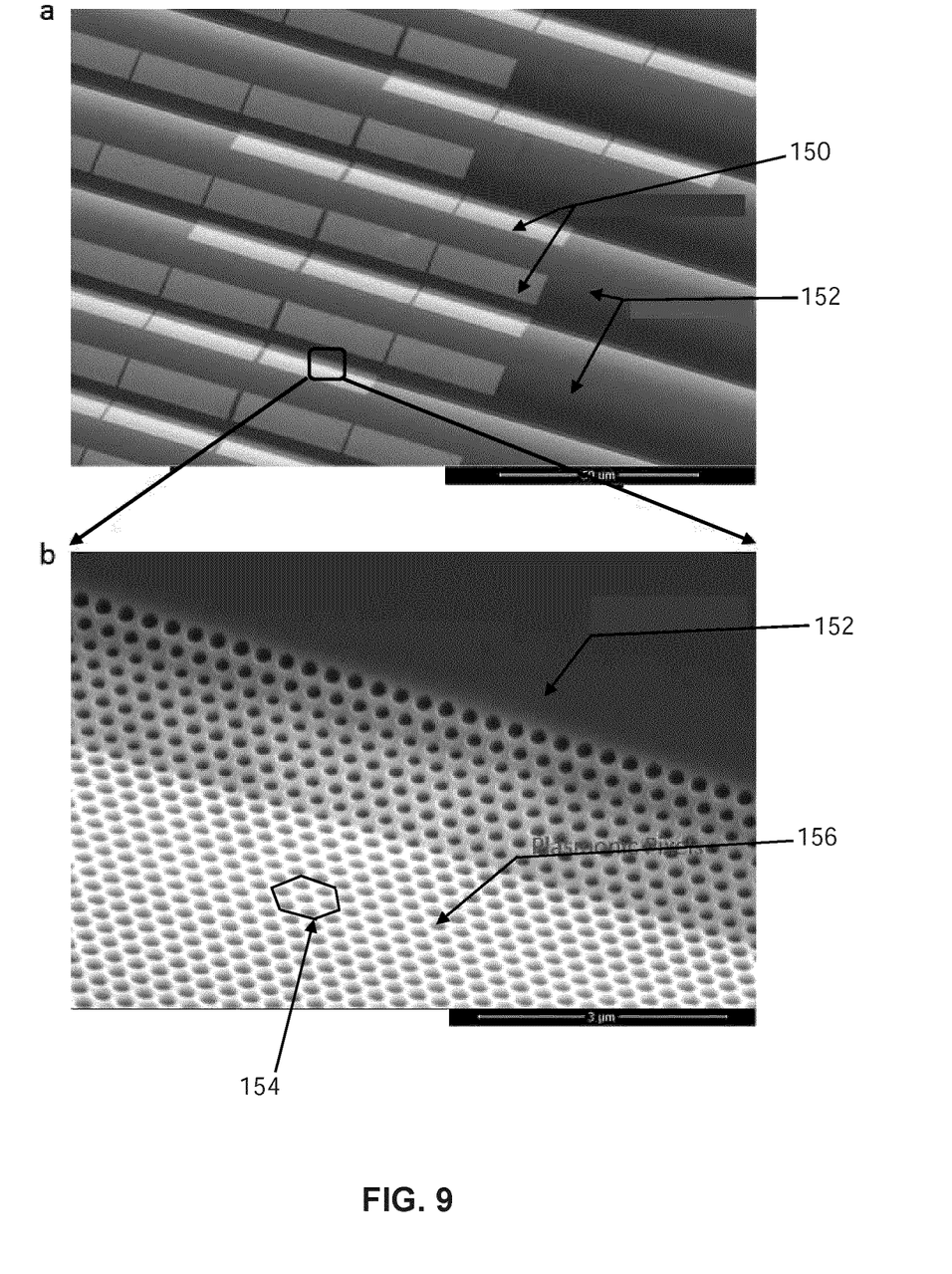
FIG. 9 includes magnified images of actual devices that include micro-structures and plasmonic nano-structures.

FIG. 9, including FIG. 9(a) and FIG. 9(b), is an example of an actual device made using the present invention. FIG. 9 shows a scanning electron microscope image of a master mold that holds a micro-surface 152 and a plasmonic surface 150 conformal to it. In this specific example, the material of the master mold is silicon; the micro-surface is designed as cylindrical cuts with the width 30 μm and height of 4 μm; and the plasmonic pixels are designed as hexagonal arrays 154 of nano-holes 156 with periodicities less than 0.4 μm, hole diameters less than 0.3 μm, and hole depth of ~0.15 μm. FIG. 9(b) is a zoomed-in (more magnified) scanning electron microscope image of the same master mold. In this size scale, the individual nano-holes and their conformality with the micro-surface can be clearly seen.

The method of fabrication of the device of FIG. 9 can include micro- and nano-fabrication steps commonly known to those who are familiar with the field. Fabrication of the specific device of FIG. 9 starts with a polished silicon wafer. The wafer is cleaned from dust and contaminates like organic materials or others that may exist on the surface. The cleaned wafer is coated with a thick layer of electron beam resist. The coated wafer is then exposed to the patterns of the micro-structures using an electron-beam lithography machine. A few more typical steps of baking and development yields patterns of micro-structures in the resist coating the silicon wafer. This soft pattern is transferred to the hard silicon by using a dry etching machine. A few more steps of chemical cleaning and baking removes the extra resist and leaves a clean silicon wafer with patterns of the designed micro-structured surface on it. This wafer is then recoated with a thin layer of electron resist. The recoated wafer is then exposed to the patterns of plasmonic structures using an electron beam lithography machine. Further steps of development, baking, dry etching, and cleaning results in formation and transfer of plasmonic structures (nano-hole arrays in this case) to the micro-surface. These steps or modified steps similar to the ones described here can yield all the devices described herein.

Figure 10:
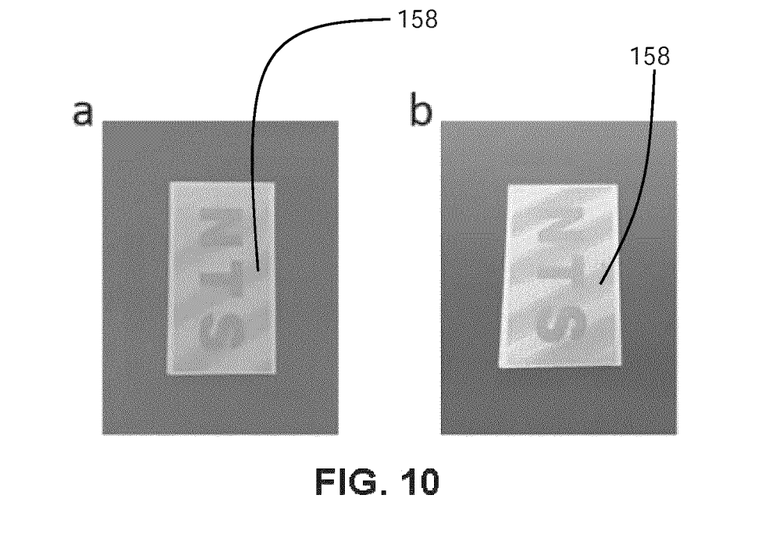
FIG. 10 includes images of a device that includes micro-structures and plasmonic nano-structures.
Figure 11:
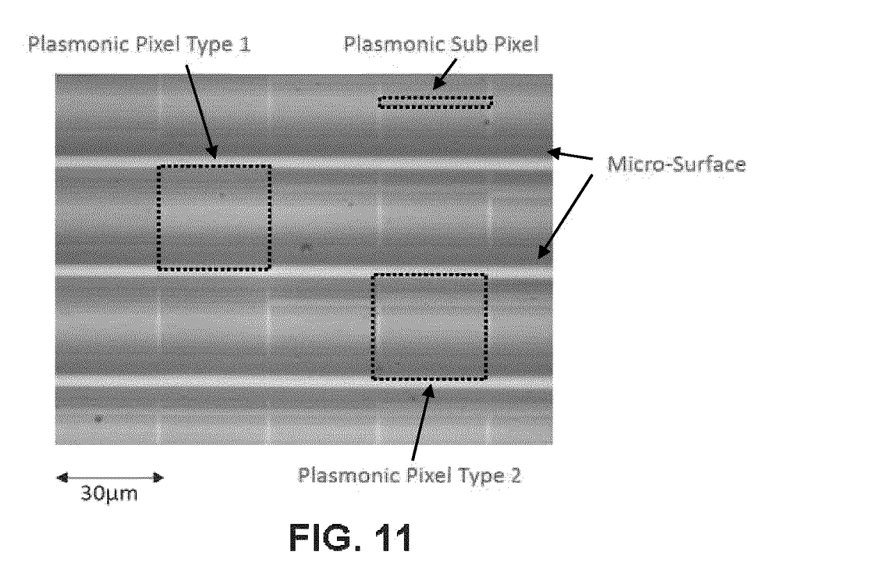
FIG. 11 is a magnified image of the device depicted in FIG. 10.

The device of FIG. 9 is only a mold that contains a specific designed surface, but it does not contain other layers (e.g. metallic layer) to enable a functional plasmonic device. The photo of an exemplar functional device is shown in FIG. 10. Here, the designed micro- and nano-structures after fabrication on a mold is casted on a different substrate, such as a plastic sheet, using an ultra-violet curable resin. A thin layer of aluminum is then deposited on the casted copy and the resulting aluminum coated casting is laminated with additional protective layers. Such casting or embossing, coating, lamination, or other operations are typically available in industrial format which may be employed for large-scale production of the devices. FIG. 10(a) shows a top view of the device, and FIG. 10(b) shows a tilt view. The device has a width of 8 mm. The phrase 'NTS' and the oblique bars display two different colors, as the plasmonic pixels used to make them are different. The phrase 'NTS' appears fixed in position with tilt of the sample, while the colored bars 158 appear to shift their positions. A photo of this sample under an optical microscope is shown in FIG. 11. The micro-surface consists of cylindrical cuts similar to the ones shown in FIG. 9. Each image pixel conformed to the micro-surface is divided into many subpixels. The sample employs two types of pixels. In pixel type 1, the plasmonic content of all the subpixels is the same. The optical effect is to display a spatially fixed but diffused content like that of the phrase 'NTS'. In pixel type 2, the plasmonic content of all the subpixels is not the same. The optical effect in this case is to display moving colored bars. Such device finds significant use for optical anti-counterfeiting applications, for example. The micro-surface for this embodiment is a curved three-dimensional shape to construct a display of moving bars with a very smooth movement appearance. The micro-surface can be replaced with a piecewise linear three-dimensional shape to display a more discrete movement.

Figure 12:
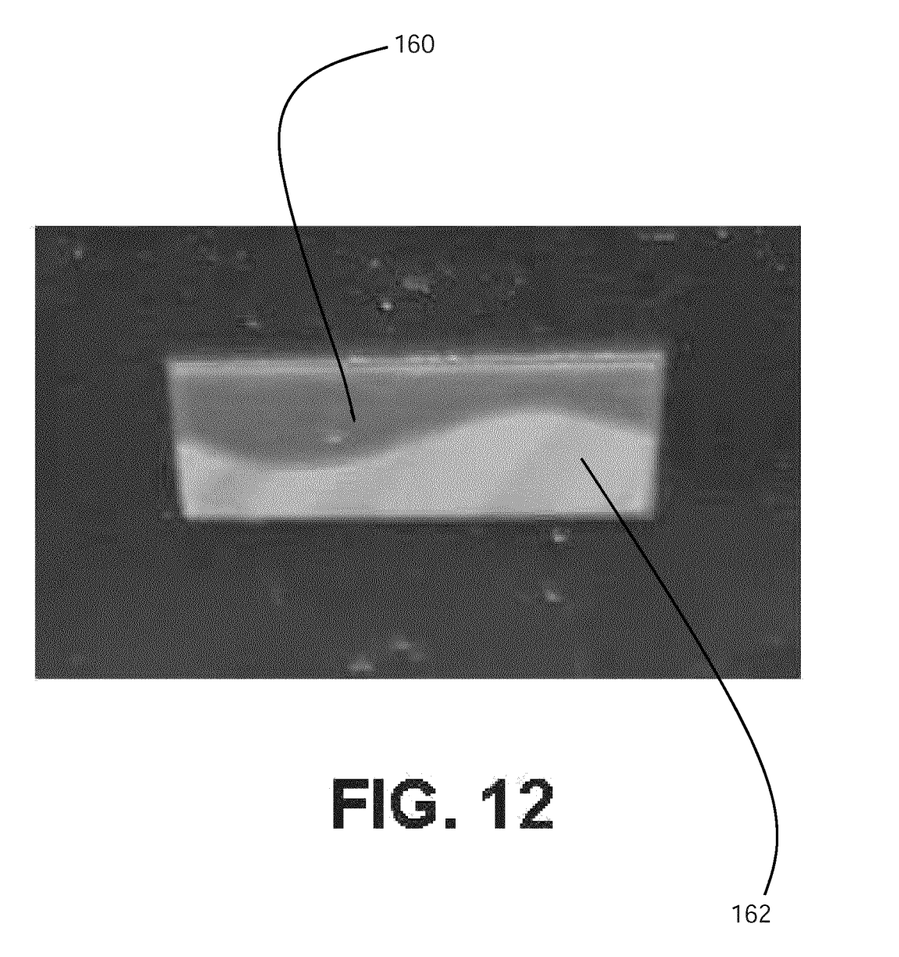
FIG. 12 is an image of a devices that include micro-structures and diffractive nano-structures.

Another illustrative device employing the present invention is shown in FIG. 12. The structure of the device is similar to that shown in FIG. 9. However, the area is divided into two parts 160, 162. In the top part 160, the micro-surface is conformably covered with one type of diffracting nano-structures, whereas in the bottom part 162, the micro-surface is conformably covered with another type of diffracting nano-structures. These nano-structures are similar to the ones shown in FIG. 9(b), but they have larger periodicities so the diffraction rather than plasmonic effects becomes dominant. The result is appearance of two diffused diffractive colors from the two regions of the device. In this specific example, the material of the master mold is silicon; the micro-surface is designed as convex half-cylindrical structure with the width 30 μm and height of 3.5 μm, and a length corresponding to the total width of the display area (e.g. 4 mm to 10 cm); and the diffracting pixels are designed as rectangular arrays of nano-holes with periodicities 0.4 μm and 0.5 μm, hole diameters less than 0.25 μm, and hole depth of ~0.11 μm. What is shown on FIG. 12 is a UV casted copy of this master mold which is coated by ~35 nm of aluminum. From the viewing side, the micro-surface is mirrored to a concave shape and nano-structures appear as nano-pillars.

Figure 13:
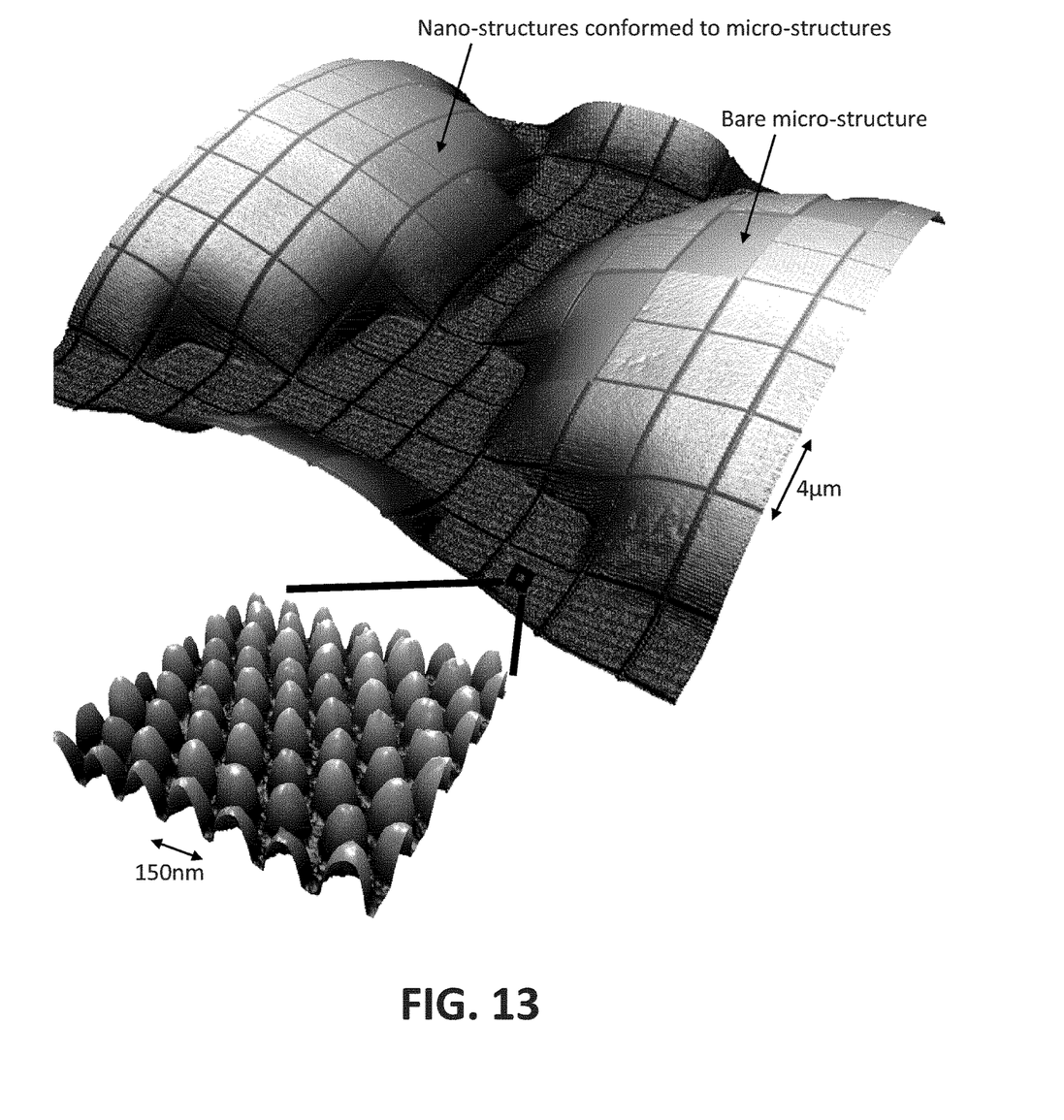
FIG. 13 includes magnified images of actual devices that include micro-structures and plasmonic nano-structures.

FIG. 13 is another example of an actual device made using the present invention. It shows an atomic force microscope image of a master mold that holds a micro-surface and a plasmonic surface conformal to it. In this specific example, the material of the master mold is nickel; the micro-surface is designed as piecewise linear spherical cuts with width of 40 μm and total height of 4 μm; and the plasmonic pixels are designed as arrays of nano-holes and nano-pillars with periodicities less than 0.3 μm, hole/pillar diameters less than 0.2 μm, hole depth of ~0.2 μm, and hole height of ~0.2 μm. The presented three dimensional image clearly shows features of an exemplary specific embodiment of the present invention.

While preferable embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments specifically described herein may be employed, including (but not limited to) varieties of geometries of micro- and nano-structures and employment of photonic, plasmonic and diffractive structures.

The illustrative embodiments herein described are not intended to be exhaustive or to limit the scope of the invention to the precise forms disclosed. They are chosen and described to explain the principles of the invention and their application and practical use. Many alterations and modifications are possible in the practice of this invention without departing from the scope of the invention, which is defined by the claims appended hereto.

What is claimed is:

1. An optical device comprising:
   a generally planar substrate;
   a plurality of micro-structures having an arcuate cross-sectional shape disposed on at least a portion of the planar substrate and arranged in a repeating pattern; and
   a plurality of nano-structures conformally disposed on at least a portion of the disposed plurality of microstructures, the plurality of nanostructures:
      providing additional means of directing incident light on the plurality of nano-structures to a space above or below the device;
      having a thickness of less than 50 μm and more than 1 μm; and
      having at least one feature size less than 500 nm;
   the device being configured such that when visible light is incident over the device, the plurality of nano-structures provides means of creating structural colors.

2. An optical device comprising:
   a plurality of surface features formed on a substrate and arranged in a repeating pattern, at least a portion of the plurality of surface features:
      having an arcuate cross-sectional shape;
      having an in-plane size of at least 2 μm and a height variation of between 1 μm and 50 μm; and
      defining a micro surface; and a second feature conformally disposed on at least a portion of the micro surface and having three-dimensional minimum feature sizes of 500 nm or less, thereby defining a plurality of nano-structures.

3. The optical device according to claim 2, wherein the nano-structures comprise a plurality of structures and materials that enable generation of the structural colors,
the plurality of structures and materials selected from the group consisting of
structures and materials that enable excitation of plasmons for generation of plasmonic colors,
structures and materials that enable generation of diffractive colors,
structures and materials that enable generation of color through excitation of optical cavities,
structures and materials that enable generation of color through excitation of modes of optical waveguides, and
structures and materials that enable generation of color through scattering and interference effects.

4. The optical device of claim 2, wherein the arcuate cross-sectional shape is configured to diffuse light reflected by the second feature conformed thereto.

5. The optical device of claim 2, wherein a second portion of the plurality of surface features:
has a flat sided cross-sectional shape; and
has a plurality of flat sides, and
wherein the second feature is conformally disposed on different flat sides of the second portion of the plurality of surface features and forms pixels of distinct images.

6. The optical device of claim 1, wherein parts or all of a surface of the device are piecewise covered with the micro-structures.

7. The optical device of claim 2, wherein at least a portion of the surface feature is covered with the second feature conformally disposed on the surface feature.

8. The optical device of claim 1, wherein the planar substrate is sandwiched by additional layers of material configured to provide one or more of refractive index matching, protection, adhesion, or filtering.

9. The optical device of claim 1, wherein the device comprises dielectric materials selected from the group consisting of plastics, resins, $SiO_2$, $TiO_2$, ZnS, and $Nb_2O_5$.

10. The optical device of claim 1, wherein the device contains metals selected from the group consisting of aluminum, silver, gold, titanium, copper, and chromium.

11. The optical device of claim 1, wherein the device is made through casting and embossing from a master mold, followed by material deposition, lamination, and coating steps.

12. The optical device of claim 1, wherein the nano-structures define a plurality of pixels to display one or more two-dimensional or three-dimensional images to an observer who observes reflected light from the device.

13. The optical device of claim 1, wherein the substrate is transparent, and the nano-structures define a plurality of pixels which function to display at least one two-dimensional or three-dimensional images to an observer who observes transmitted light through the device.

14. The optical device of claim 1, wherein the nano-structures define a plurality of pixels which display static or dynamic two-dimensional or three-dimensional imagery to an observer who observes reflected light from and/or transmitted light through the device.

15. The optical device of claim 1, wherein an optical function of the device is to display content to a naked eye or to read out instruments.

16. An optical device comprising:
a generally planar substrate;
a plurality of micron-sized surface features arranged in a repeating pattern and extending from a plane of the substrate, the surface features having an arcuate cross-sectional shape having a height variation less than 50 µm and more than 1 µm, thereby defining a plurality of microsurfaces; and
means for creating a plasmonic optical effect on optical frequency incident light, the means for creating the plasmonic optical effect formed on the micro-surfaces and conforming to some or all of the surface features of the plurality of microstructures.

17. An optical device comprising:
a generally planar substrate;
a plurality of micron-sized surface features arranged in a repeating pattern extending from a plane of the substrate, the surface features having an arcuate cross-sectional shape having a height variation less than 50 µm and more than 1 µm, thereby defining a plurality of microsurfaces; and
means for creating a diffractive optical effect on optical frequency incident light, the means employing features having at least one sub-micron feature dimensions formed on the microsurfaces and conforming to some or all of the surface features of the microstructures.

18. The optical device of claim 16 or 17, wherein the means for creating an optical effect comprises a plurality of nano-structures on the micro-surfaces.

19. The optical device of claim 18, wherein the nano-structures comprise arrays of nano-holes, the array of nano-holes having at least one of sub-micron periodicity, sub-micron hole diameters, and sub-micron hole depth.

20. The optical device of claim 18, wherein the nano-structures comprise arrays of nano-columns, each of the arrays of nano-columns having at least one of sub-micron periodicity, submicron diameters, and sub-micron height.

21. The optical device of claim 16, wherein the means for creating an optical effect comprises a plurality of nano-structures on the micro-surfaces.

22. The optical device of claim 1, wherein the nano-structure comprise holes defined in a surface of the micro-structures.

23. The optical device of claim 22, comprising a layer of material disposed on the surface of the micro-structures, and wherein the holes are defined in the layer of material.

24. The optical device of claim 1, wherein the plurality of nano-structures are arranged in a repeating pattern.

25. The optical device of claim 24, wherein the plurality of nano-structures are arranged in a two-dimensional array.

* * * * *